United States Patent
Mostovoy et al.

(10) Patent No.: US 9,899,347 B1
(45) Date of Patent: Feb. 20, 2018

(54) WIRE BONDED WIDE I/O SEMICONDUCTOR DEVICE

(71) Applicant: SANDISK TECHNOLOGIES LLC, Plano, TX (US)

(72) Inventors: Michael Mostovoy, San Ramon, CA (US); Gokul Kumar, San Jose, CA (US); Ning Ye, San Jose, CA (US); Hem Takiar, Fremont, CA (US); Venkatesh P. Ramachandra, San Jose, CA (US); Vinayak Ghatawade, Bangalore (IN); Chih-Chin Liao, Changhua (TW)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/454,194

(22) Filed: Mar. 9, 2017

(51) Int. Cl.
*H01L 25/065* (2006.01)
*H01L 25/00* (2006.01)
*H01L 23/00* (2006.01)
*H01L 21/56* (2006.01)
*H01L 21/78* (2006.01)

(52) U.S. Cl.
CPC .............. *H01L 24/49* (2013.01); *H01L 21/56* (2013.01); *H01L 21/78* (2013.01); *H01L 24/43* (2013.01); *H01L 24/48* (2013.01); *H01L 25/0657* (2013.01); *H01L 25/50* (2013.01); *H01L 2224/48145* (2013.01); *H01L 2224/49174* (2013.01); *H01L 2224/49175* (2013.01); *H01L 2924/1436* (2013.01); *H01L 2924/14511* (2013.01)

(58) Field of Classification Search
CPC . H01L 2224/48227; H01L 2224/32145; H01L 2224/481145; H01L 25/0657; H01L 23/481

See application file for complete search history.

(56) References Cited

U.S. PATENT DOCUMENTS

| | | | | |
|---|---|---|---|---|
| 7,420,281 B2 * | 9/2008 | Tsunozaki | ............... | H01L 23/60 257/723 |
| 7,514,796 B2 * | 4/2009 | Saeki | ................ | H01L 23/49833 257/202 |
| 7,683,491 B2 * | 3/2010 | Itoh | ......................... | H01L 23/50 257/685 |
| 8,134,852 B2 * | 3/2012 | Kim | ..................... | G06F 13/4234 365/191 |
| 9,455,036 B1 * | 9/2016 | McKernan | ............ | G11C 11/409 |
| 2006/0055018 A1 * | 3/2006 | Sekiguchi | ........... | H01L 25/0657 257/686 |

* cited by examiner

*Primary Examiner* — Caridad Everhart
(74) *Attorney, Agent, or Firm* — Vierra Magen Marcus LLP

(57) ABSTRACT

A wide I/O semiconductor device is disclosed including a memory die stack wire bonded to an interface chip. The stack of memory die may be wire bonded to the interface chip using a wire bond scheme optimized for die-to-die connection and optimized for the large number of wire bond connections in a wide I/O semiconductor device. This method can achieve significant BW increase by improving packaging yield and costs, not possible with current packaging schemes.

26 Claims, 9 Drawing Sheets

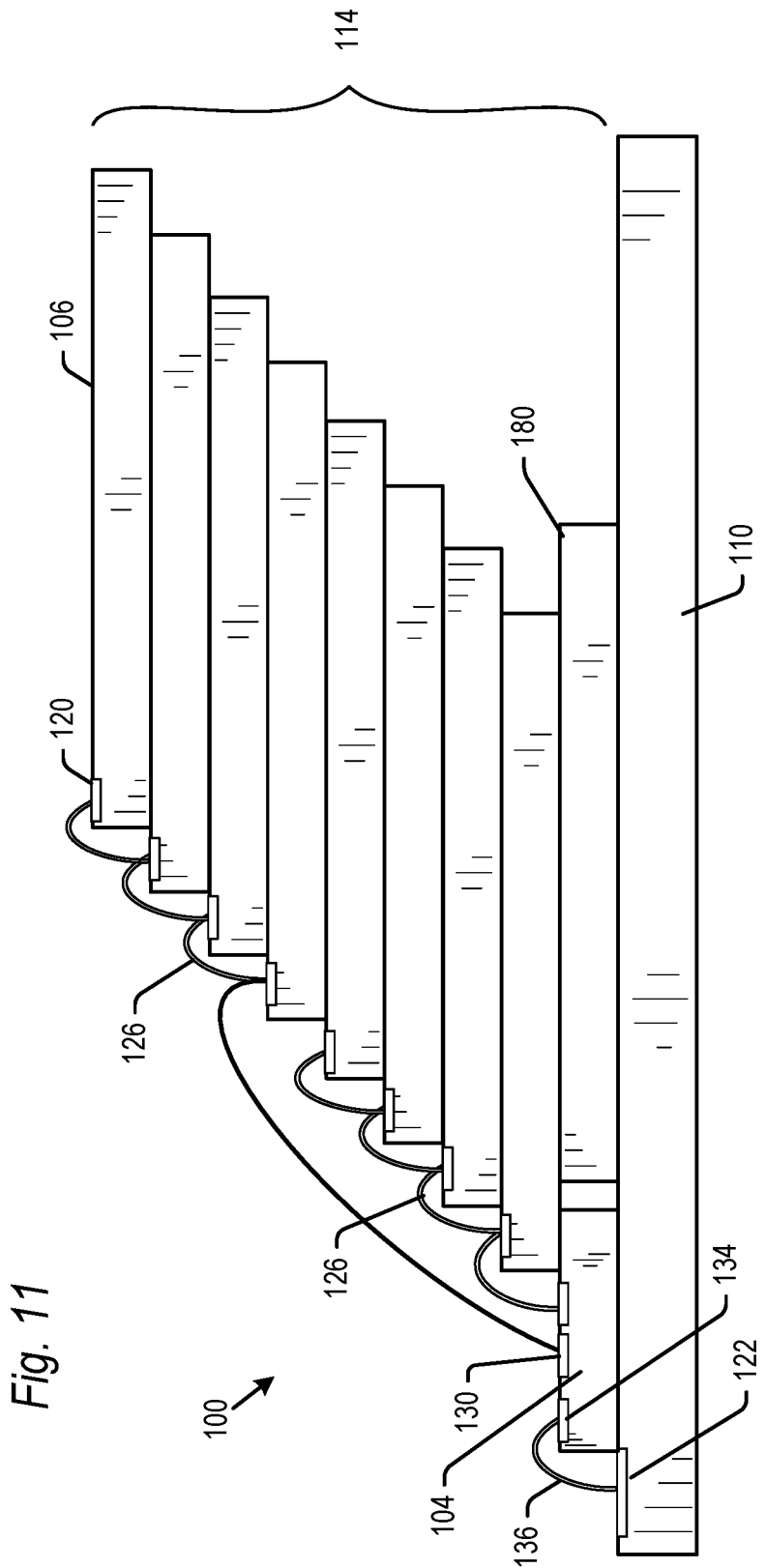

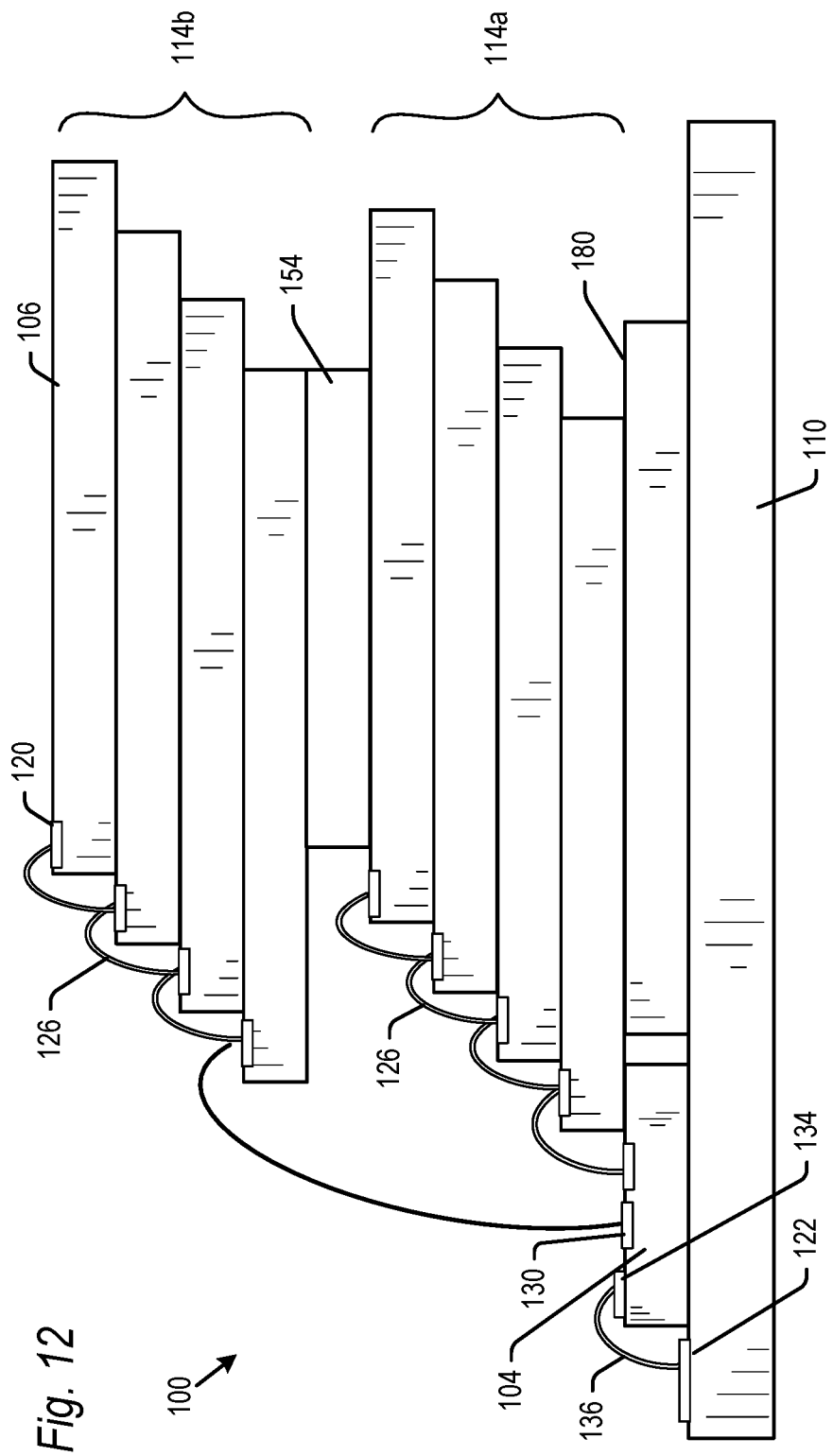

ns is driving the need for high-capacity storage
WIRE BONDED WIDE I/O SEMICONDUCTOR DEVICE The strong growth in demand for portable consumer electronics is driving the need for high-capacity storage devices. Semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example cellular telephones, digital cameras, personal digital assistants, medical electronics, mobile computing devices, non-mobile computing devices and data servers.

Semiconductor memory may comprise non-volatile memory or volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

Such semiconductor memory generally include one or more memory die and a controller die such as an ASIC mounted and electrically coupled to a substrate. The memory die and controller die may be wire bonded to the substrate, and then encapsulated in a mold compound to form a completed semiconductor package. Conventional NAND memory packages have a small number of data pins (eight), which enables sufficient tradeoff between today's system performance and costs. These data connections are routed through the packaging substrate before bonding again to the controller die. Therefore, the pad layout of conventional semiconductor memory dies have been optimized to enable wire bond connections to the substrate for both the memory die and controller die.

While a variety of semiconductor memory configurations are known, wide input/output (I/O) is a developing technology where stacked memory die may be mounted on a substrate. This methodology requires a much larger number of electrical connections between the memory die and substrate (>10×), which presents new challenges in the bonding, layout and yield of the electrical connections within the semiconductor package. Therefore, the industry is looking to migrate to through-silicon vias or other interconnect technologies to solve this problem, which presents much higher cost option.

DESCRIPTION OF THE DRAWINGS

FIGS. 11-12 are edge views of semiconductor devices including semiconductor die, an interface chip and wire bonds according to further alternative embodiments of the present technology.

DETAILED DESCRIPTION

Embodiments will now be described with reference to the figures, which relate to a wide I/O semiconductor device including a memory die stack wire bonded to an interface chip. In embodiments, the semiconductor device includes a stack of memory die mounted on an interface chip, where the layout of the memory die and interface chip are optimized for electrical wire bonding connection to each other. The memory die stack may now be directly wire bonded to the interface chip, providing multiple channels of I/O between the memory die stack and the interface chip using for example a 64 or 80 bit interface bus. Using a wide, wire bonded I/O allows the bus to transfer data at higher overall throughput but using lower power as compared for example to a conventional 8 bit bus. Since there are now a much larger number of data connections, this simple approach can enable dramatic improvement in packaging yield, and lower costs. Certain functionality common to the memory die in the stack may also be offloaded onto the interface chip.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal" as may be used herein are by way of example and illustrative purposes only, and are not meant to limit the description of the invention inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25%.

Figure 1:
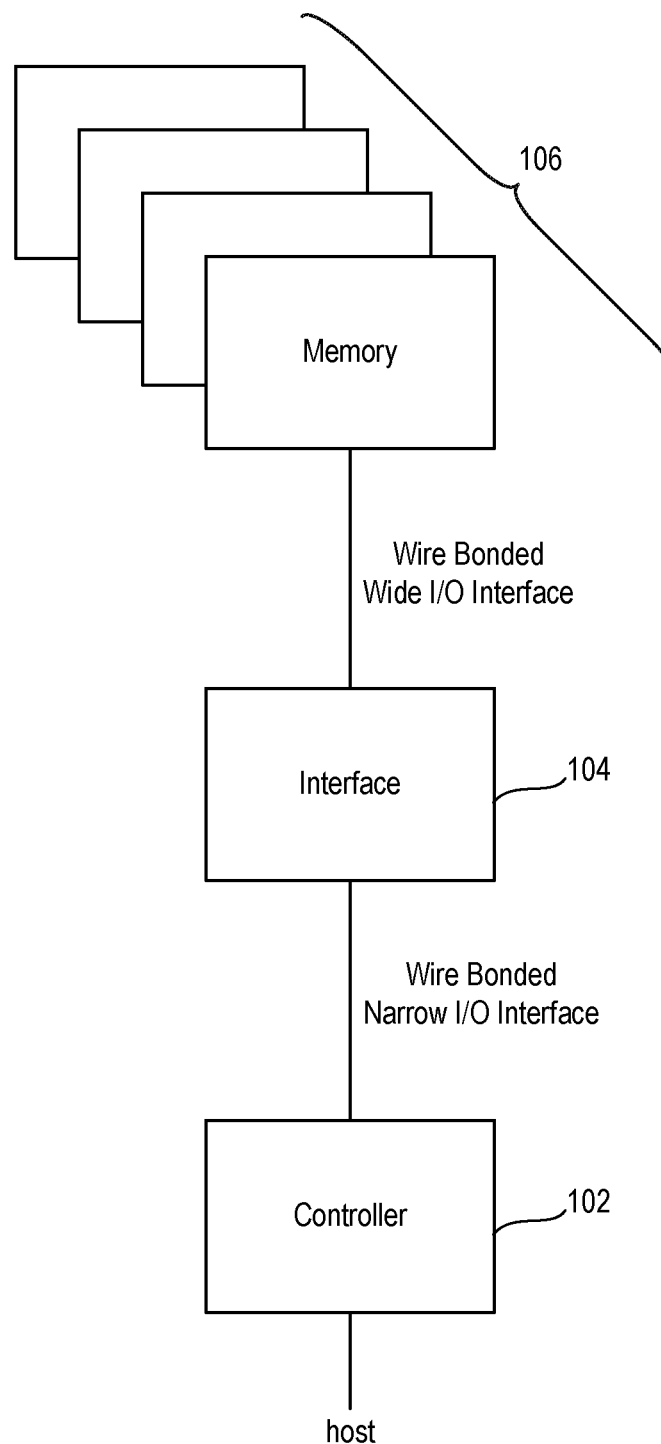
FIG. 1 is a high level block diagram illustrating a semiconductor device having a controller, interface chip and a plurality of memory die.

FIG. 1 is a high level block diagram, which shows a memory device 100 including a controller 102, an interface circuit 104, and a plurality of memory die 106 that are electrically coupled together. The interface circuit 104 is physically separate from the plurality of memory die 106. Each memory die 106 of the plurality of memory die 106 includes a wide I/O interface electrically coupled to another wide I/O interface of another memory die of the plurality of memory die 106. In one embodiment, all of the wide I/O interfaces of all of the memory die of the plurality of memory die 106 are connected together. Interface circuit 104 has a first interface and a second interface. The first interface is a wide I/O interface that is electrically coupled to a wide I/O interface of one or more of the memory die of the plurality of memory die 106. The second interface may be a narrow I/O interface with less signals than the wide I/O interface and is configured to communicate with controller 102. Thus, interface circuit 104 is an electrical circuit that translates between two different interfaces. In some embodiments, interface circuit 104 is adapted to communicate directly with a host via the second interface.

The use of the plurality of memory die 106 provides for higher storage capacity. The wide I/O interface provides high performance. Interface circuit 104 allows the system to be manufactured at a reasonable cost. For example, some of the circuits that typically would be found in each of the memory die can be simplified (area reduction) or moved to interface circuit 104, thereby reducing the cost of each memory die for a total cost reduction that is more than the cost of using interface circuit 104.

Further details of the present technology will now be explained with reference to the flowchart of FIG. 2 and the perspective, edge and top views of the semiconductor device 100 in FIGS. 3-6. Although FIGS. 3-6 for example show an individual device 100, or a portion thereof, it is understood that the device 100 may be batch processed along with a plurality of other devices 100 on a substrate panel to achieve economies of scale. The number of rows and columns of devices 100 on the substrate panel may vary.

The substrate panel begins with a plurality of substrates 110 (again, one such substrate is shown in FIGS. 3-6). The substrate 110 may be a variety of different chip carrier mediums, including a printed circuit board (PCB), a leadframe or a tape automated bonded (TAB) tape. Where substrate 110 is a PCB, the substrate may be formed of a core having a top and/or bottom conductive layer. The core may be formed of various dielectric materials such as for example, polyimide laminates, epoxy resins including FR4 and FR5, bismaleimide triazine (BT), and the like. The conductive layer(s) surrounding the core may be formed of copper or copper alloys, plated copper or plated copper alloys, Alloy 42 (42Fe/58Ni), copper plated steel, or other metals and materials known for use on substrate panels.

Figure 2:
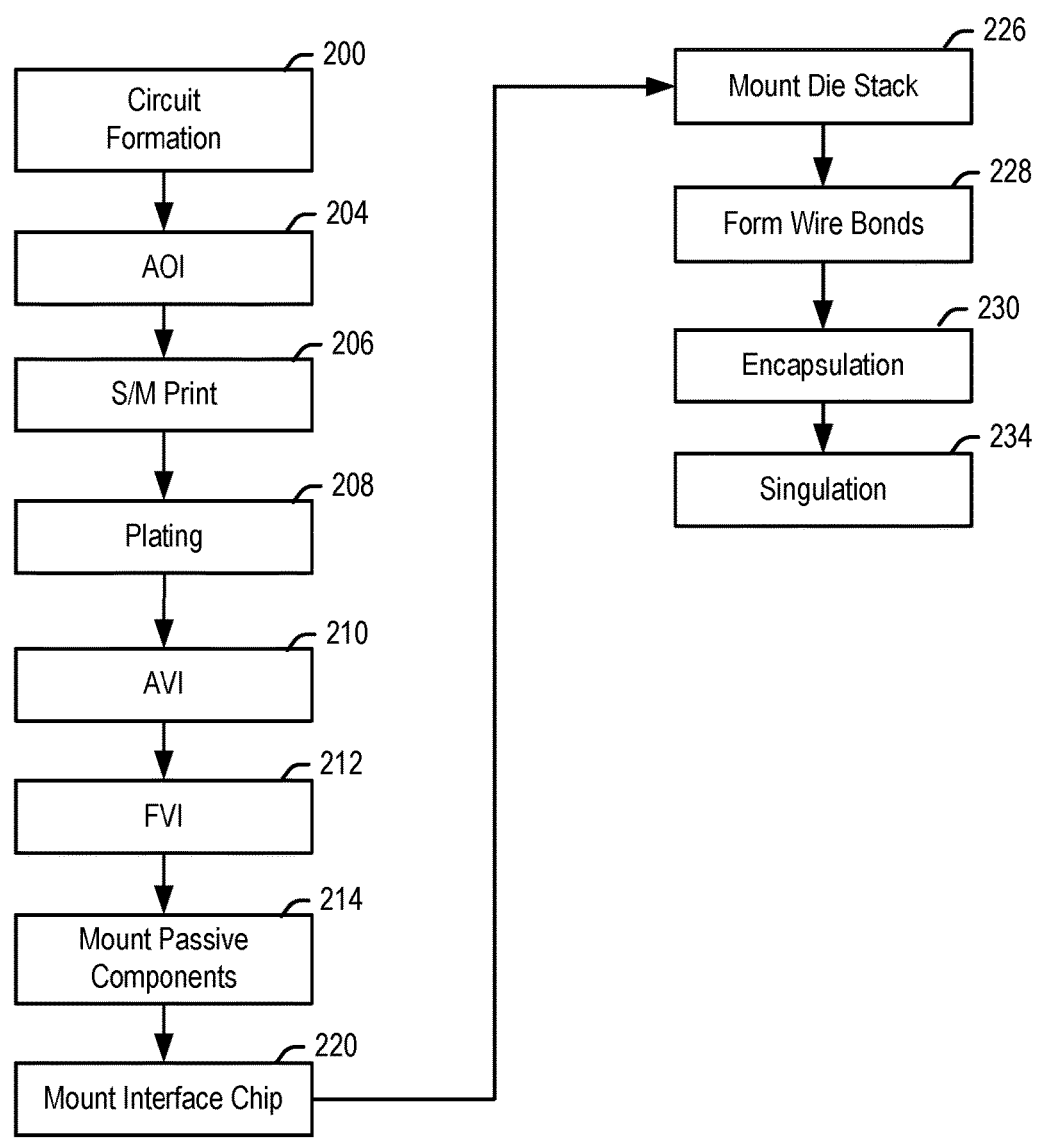
FIG. 2 is an example of a flowchart for the assembly of a semiconductor device according to embodiments of the present technology.

FIG. 2 is a flowchart of the fabrication process for forming a semiconductor device according to embodiments of the present invention. In a step 200, the conductance pattern including contact pads, electrical traces and vias may be formed on one or both of the top and bottom conductive layers. The conductance pattern on the top and/or bottom surfaces of the substrate 110 may be formed by a variety of known processes, including for example various photolithographic processes.

The substrate 110 may then be inspected in an automatic optical inspection (AOI) in step 204. Once inspected, a solder mask may be applied to the substrate in step 206. After the solder mask is applied, the contact pads and any other solder areas on the conductance patterns may be plated with a Ni/Au, Alloy 42 or the like in step 208 in a known electroplating or thin film deposition process. The substrate 110 may then be inspected and tested in an automated inspection process (step 210) and in a final visual inspection (step 212) to check electrical operation, and for contamination, scratches and discoloration. Assuming the substrate 110 passes inspection, passive components 112 may next be affixed to the substrate in a step 214. The one or more passive components may include for example one or more capacitors, resistors and/or inductors, though other components are contemplated. The passive components 112 shown are representative and there may be more, less or different passive components in further embodiments.

In accordance with the present technology, a semiconductor die 104, referred to herein as interface circuit 104 or interface chip 104, may next be mounted on substrate 110 in step 220. Certain circuits and logical functionality conventionally provided on memory die (explained below) are offloaded onto the interface chip 104. Example of logic which may be moved to the interface chip 104 is SERDES between the narrow interface and wide internal Flash bus, and circuits related to high speed narrow interface which consume a lot of power and occupy a large area. A third example is the I/O output buffer which may be smaller and lower capacitance when moved to the interface chip as it does not need to drive high speed anymore.

Moving this functionality to the interface chip simplifies the high speed data path and also helps reduce power. Additionally, the interface chip 104 provides flexibility to the design of the semiconductor device 100, for example in that it can be manufactured in an advanced CMOS process which allows the interface chip 104 to be manufactured with a much smaller size than, for example, the memory die 106 in the die stack 114. Moreover, inclusion of the interface chip 104 allows routing optimization of the wire bond connections as explained below.

Figure 3:
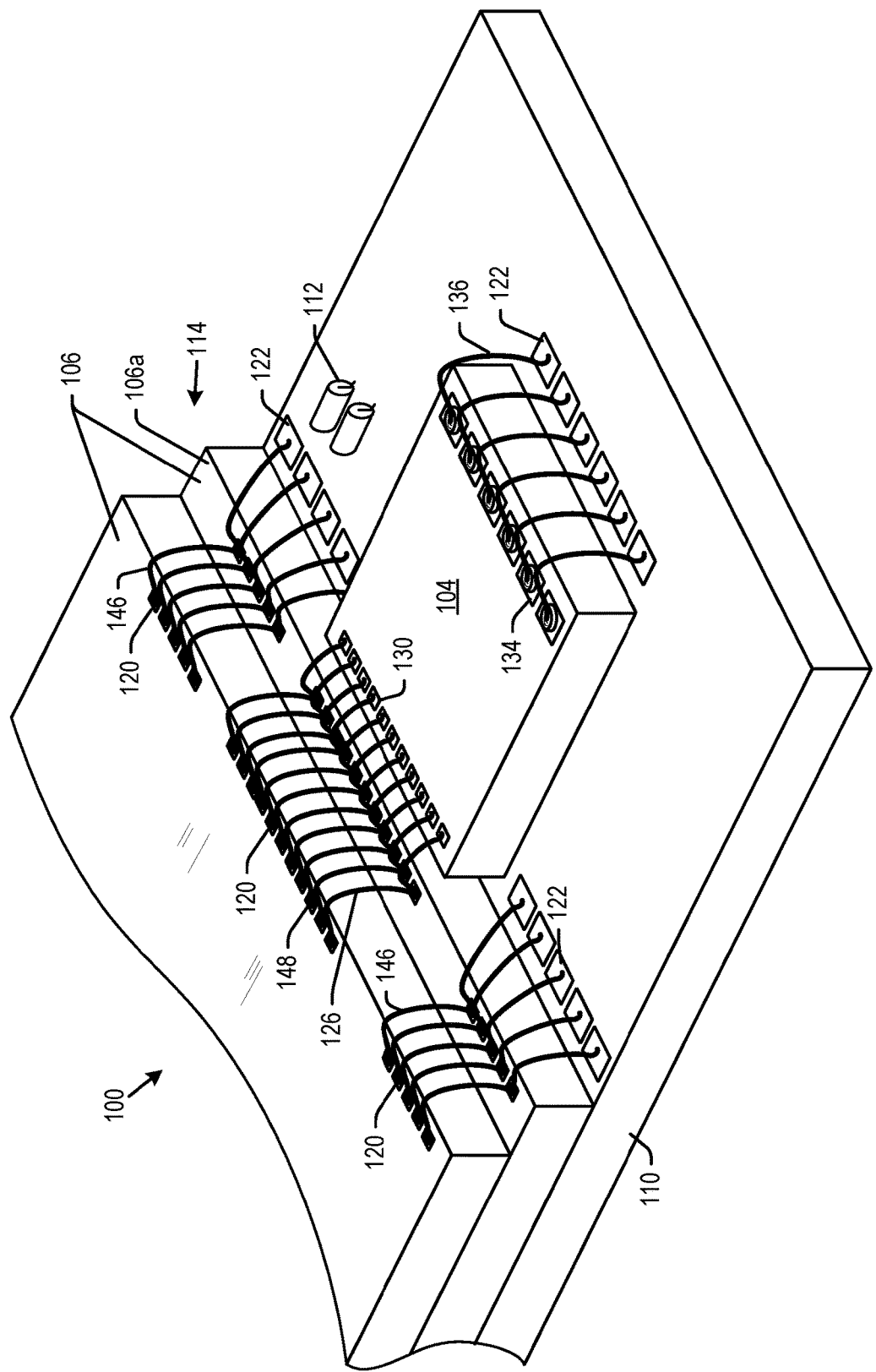
FIGS. 3-6 are perspective, top and edge views, respectively, of a semiconductor device including semiconductor die, an interface chip and wire bonds according to an embodiment of the present technology.
Figure 4:
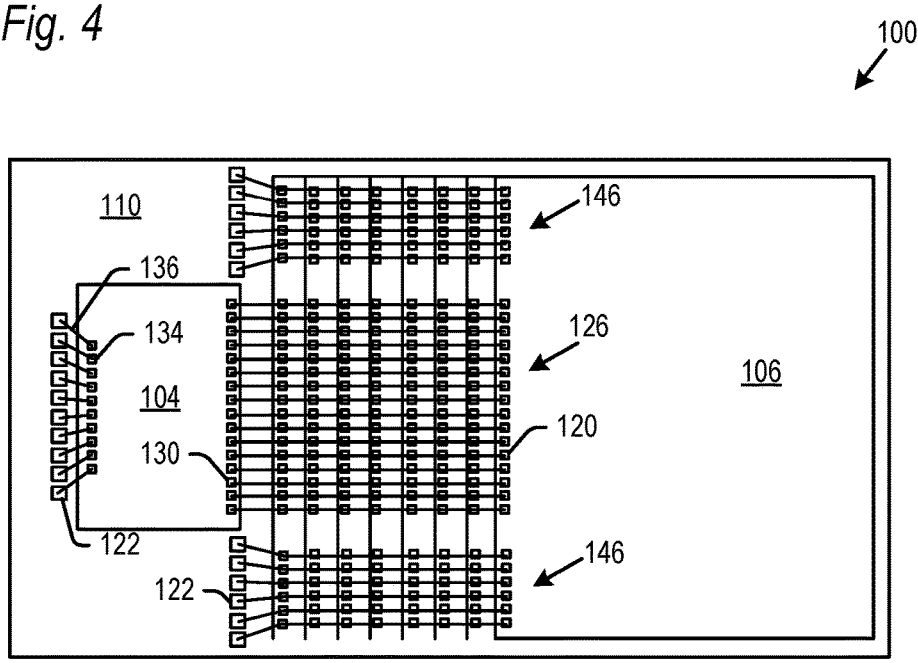
Figure 5:
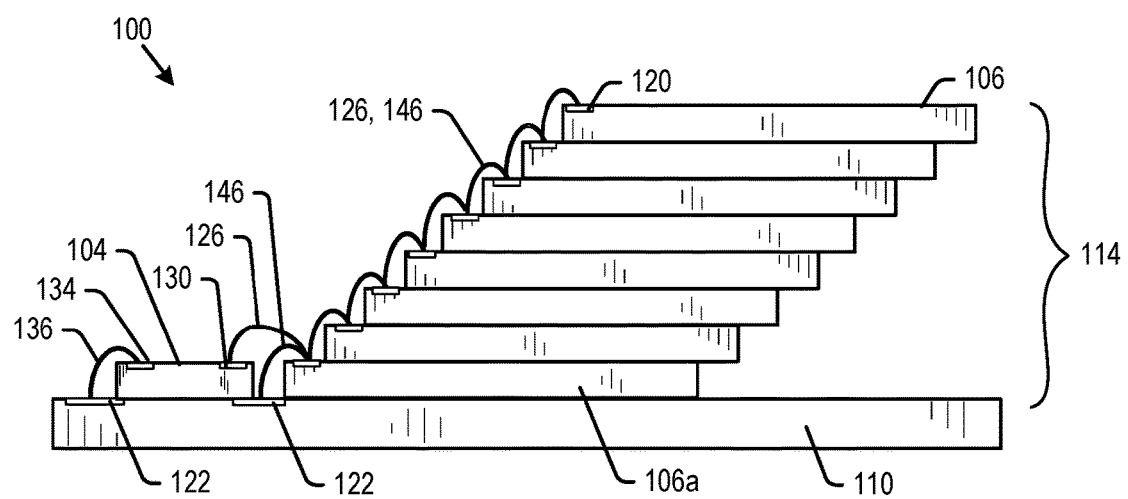

In step 226, a stack of semiconductor die 106 may next be mounted on the substrate 110. FIG. 3 is a simplified perspective view showing the substrate 110, interface chip 104 and the bottom two die 106 in a die stack 114. Die stack 114 may comprise various numbers of die, including for example 4, 8, 16, 32, 64 or other numbers of semiconductor die. A number of semiconductor die 106 may be stacked atop each other in a continuous offset stepped configuration as shown in FIGS. 3-5 to form the die stack 114. The die may be mechanically affixed to each other and the substrate 110 using a die attach film. As one example, the die attach film may be 8988UV epoxy from Henkel AG & Co. KGaA, cured to a B-stage to preliminarily affix the die 106 in the stack 114, and subsequently cured to a final C-stage to permanently affix the die 106 in the stack 114.

The semiconductor die 106 may for example be non-volatile memory die such a NAND flash memory die, but other types of die 106 may be used, including for example random access memory die such as DRAM chips.

The memory die 106 and interface chip 104 may next be electrically connected to each other and the substrate 110 in a wire bonding step 228. For wide I/O data transfer, it would be difficult or impossible to wire bond the large number of die connections to the contact pads of a conventional substrate. Therefore, in accordance with aspects of the present technology, the wire bond scheme is optimized for routing wide I/O signals (for example 64 or 80 bits) from the semiconductor die 106 to the interface chip 104. The interface chip in turn includes wire bonds to the substrate to transfer narrow I/O signals (for example 8 bit).

The semiconductor die 106 may include small, densely packed die bond pads 120 aligned along a leading edge of each of the semiconductor die 106. In one embodiment, each die bond pad 120 may be 35 μm×35 μm, and spaced from each other by 50 μm. It is understood the size and spacing of the die bond pads 120 may vary in further embodiments. Given the large number of die bond pads 120 for wide I/O data transfer and the small size of the die bond pads 120, it would be difficult or impossible to make the necessary connections to the relatively larger contact pads 122 given the space constraints on substrate 110.

This problem is addressed by the use of the interface chip 104 and a wire bond scheme as will now be described with references to FIGS. 3-5. In an embodiment, the wire bond scheme may include a first set of wire bonds 126 forming at least substantially straight, parallel lines (without diagonal connections or fan out) between the die bond pads 120 on the die 106 in the die stack 114 and the interface chip 104. The number of die bond pads 120 and wire bonds 126 are shown for simplicity, and is understood that the wide I/O connection may include many more die bond pads 120 and wire bonds 126 than are shown. The wire bonds 126 connect corresponding die bond pads 120 from each semiconductor die to each other to establish wide I/O electrical connections between each semiconductor die 106.

The interface chip 104 may include a first set of die bond pads 130 (again, there may be many more die bond pads 130 than are shown). The die bond pads 130 on chip 104 may be of the same size and have the same spacing as die bond pads 120 on die 106. Thus, wire bonds 126 may each extend in a straight line from the bottommost semiconductor die 106*a* in the stack 114 to the die bond pads 130 on the interface chip to establish wide I/O electrical connections between each semiconductor die in the stack 114 and the interface chip 104.

Interface chip 104 may further include a second set of die bond pads 134. The die bond pads 134 may be wire bonded to contact pads 122 on substrate 110 via wire bonds 136 to establish narrow I/O electrical connections between the interface chip 104 and the substrate 110. The narrow I/O die bond pads 134 may be the same size as contact pads 122 on substrate 110, such as for example 70×70 μm. The die bond pads 134 may be smaller in further embodiments, such as for example the same size as die bond pads 130. There may also be more die bond pads 134 and wire bonds 136 than are shown. The wire bonds 136 may extend in straight, parallel lines to each other, for example where the die bond pads 134 and contact pads are the same size. Where the die bond pads 134 are smaller than the contact pads 122, the wire bond 136 may fan out.

Since the memory die is typically much larger than the interface chip, there can be additional pads on the memory die that can be retained to be directly bonded to the substrate, as required. While typically used for directly powering the memory, the pads may also be used to directly test the NAND die stack. The size of these pads and pitch density may or may not be reduced relative to other pads on the memory die that get wire bonded to the interface chip 104. In embodiments, all electrical connections between the die 106 in stack 114 and the substrate 110 may occur through the interface chip 104 (i.e., via wire bonds 126 and 136). However, in other embodiments, shown in FIGS. 3-5, there may additionally be wire bonds extending directly between the die 106 in stack 114 and the substrate 110. For example, wire bonds 146 may extend in straight, parallel lines between corresponding die bond pads 120 of the respective die 106 in the die stack, and then fan out to contact pads 122 on the substrate 110 from the bottom die 106*a*. The wire bonds 146 between the die and substrate may be formed on one or both sides of the interface chip 104 as shown. As above, the number of wire bonds 146 shown is by way of example, and there may be more in further embodiments.

As noted, the present technology provides an electrical connection scheme for wide I/O connections which are not found in conventional semiconductor packages. For example, the interface chip 104 includes a first set of wide I/O die bond pads 130 for signal transfer to/from the semiconductor die 106, and a second set of narrow I/O die bond pads for signal transfer to/from the substrate 110. Additionally, wire bonds 126 are densely packed, and extend in straight parallel lines, optimizing the large number of electrical connections that exist between the semiconductor die 106 and the interface chip 104.

Each of the wire bonds 126, 136 and 146 may be formed by a variety of technologies, including for example bonding a ball 148 on the die bond pads 120, 130 and contact pads 122 by a wire bond capillary (not shown), and then forming the bonds to/from the ball bonds 148. Ball bonds 148 may be formed by a variety of other methods including for example stud bumping or gold bumping at the wafer level. Other wire bonding techniques may be used including stich and wedge bonding.

Figure 6:
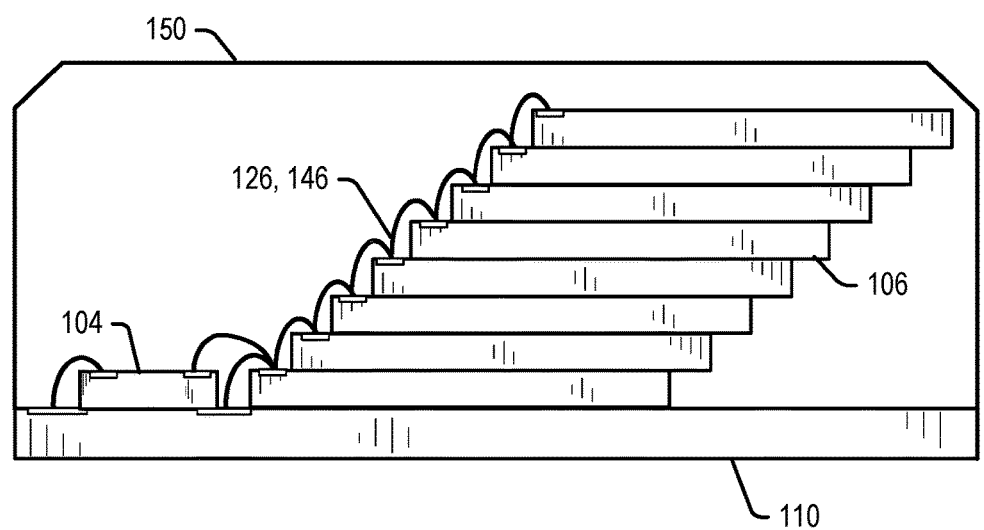

Following mounting and electrical connection of the die stack 114 and interface chip 104, the die stack, interface chip, wire bonds and at least a portion of the substrate may be encapsulated in a mold compound 150 in a step 230 and as shown in FIG. 6. Mold compound 140 may include for example solid epoxy resin, Phenol resin, fused silica, crystalline silica, carbon black and/or metal hydroxide. Such mold compounds are available for example from Sumitomo Corp. and Nitto-Denko Corp., both having headquarters in Japan. Other mold compounds from other manufacturers are contemplated. The mold compound may be applied according to various known processes, including by transfer molding or injection molding techniques. The encapsulation process may be performed by FFT (Flow Free Thin) compression molding in further embodiments. The substrate panel including a number of semiconductor devices 100 may then be singulated into individual semiconductor devices 100 in step 234 to complete the fabrication of the devices 100.

Figure 7:
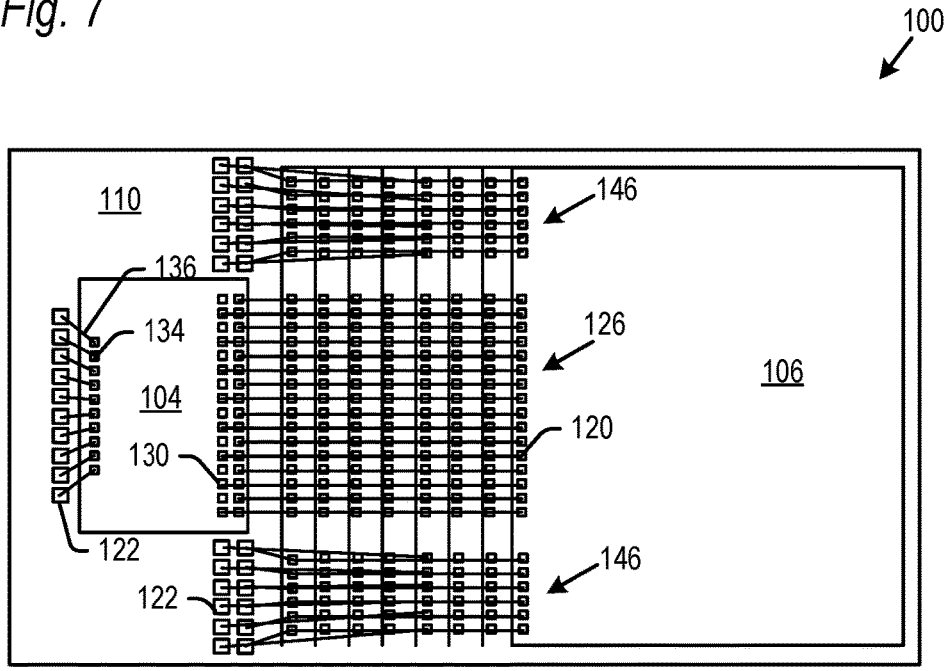
FIGS. 7-8 are top and edge views, respectively, of a semiconductor device including semiconductor die, an interface chip and wire bonds according to an alternative embodiment of the present technology.
Figure 8:
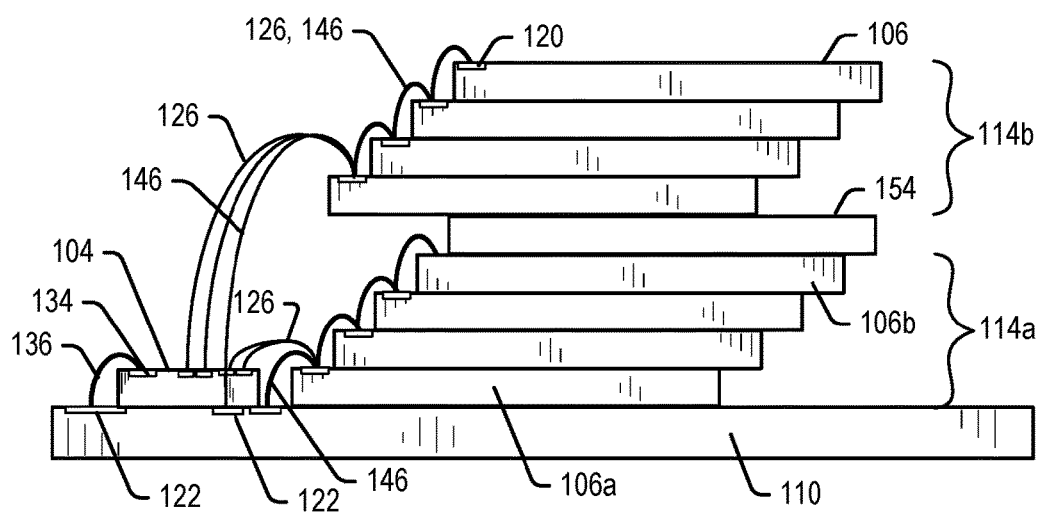

FIGS. 7-12 each show further embodiments of a semiconductor device including an interface chip and a wire bond scheme optimized for die-to-die connection (i.e., memory die to interface chip connection). The embodiment shown in the top and edge views of FIGS. 7-8 are similar to the embodiment shown in FIGS. 3-6, with one difference being that the die stack 114 is formed of two separate groups of semiconductor die, 114*a* and 114*b*. The first group 114*a* of semiconductor die 106 are stacked in a stepped offset pattern, and the second group 114*b* of semiconductor die 106 are stacked in a stepped offset pattern in the same direction as the first group 114*a*. However, the first group 114*a* are offset from the second group 114*b*. While two groups of semiconductor die are shown, there may be greater that two groups in further embodiments.

In order to provide access to the uppermost die 106*b* in first group 114*a*, the second group 114*b* is spaced above the first group 114*a* by a spacer 154. The spacer 154 may be formed of various dielectric materials, including for example silicon dioxide. In further embodiments, the spacer 154 may be a film layer, allowing for the possibility that the spacer 154 extends to the leading edge of the die 106*b*, and the wire bonds are buried within the spacer layer 154.

In an embodiment, the first group 114*a* of semiconductor die may include a set of wire bonds 156 forming at least substantially straight, parallel lines (without diagonal connections or fan out) between the die bond pads 120 on the die 106 in the group 114*a*. The wire bonds 156 connect corresponding die bond pads 120 from each semiconductor die to each other to establish wide I/O electrical connections between each semiconductor die 106 in the group 114*a*. Similarly, the second group 114*b* of semiconductor die may include a set of wire bonds 156 forming at least substantially straight, parallel lines between the die bond pads 120 on the die 106 in the group 114*b*. The wire bonds 156 connect corresponding die bond pads 120 from each semiconductor die to each other to establish wide I/O electrical connections between each semiconductor die 106 in the group 114b.

In any of the embodiments described herein, the interface chip 104 may include multiple rows of die bond pads 160 to accommodate the large numbers of die connections from the semiconductor die 106. In the embodiment of FIGS. 7 and 8, there may be at least two pairs of die bond pad rows to receive the wire bonds from the first and second groups of die 114a, 114b. The die bond pads 160 on chip 104 may be of the same size and have the same spacing as die bond pads 120 on die 106. Thus, wire bonds 156 may each extend in a straight line from the bottommost semiconductor die 106a in the first group 114a to the first pair of rows of the die bond pads 160 on the interface chip. Similarly, the wire bonds 156 may each extend in a straight line from the bottommost semiconductor die 106a in the second group 114b to the second pair of rows of the die bond pads 160 on the interface chip. This wire bonding scheme provides wide I/O electrical connections between each semiconductor die in the stack 114 and the interface chip 104.

The wire bonds 136 between the interface chip 104 and substrate may be formed as described above. Also as above, each group 114a, 114b may have also die bond pads 120 with direct connections to the substrate 110 via wire bonds 166. For example, wire bonds 166 may extend in straight, parallel lines between corresponding die bond pads 120 of the respective die 106 in the group 114a, and then fan out to a first set of contact pads 122 on the substrate 110 from the bottom die 106a in group 114a. Wire bonds 166 may also extend in straight, parallel lines between corresponding die bond pads 120 of the respective die 106 in the group 114b, and then fan out to a second set of contact pads 122 on the substrate 110 from the bottom die 106a in group 114b.

Figure 9:
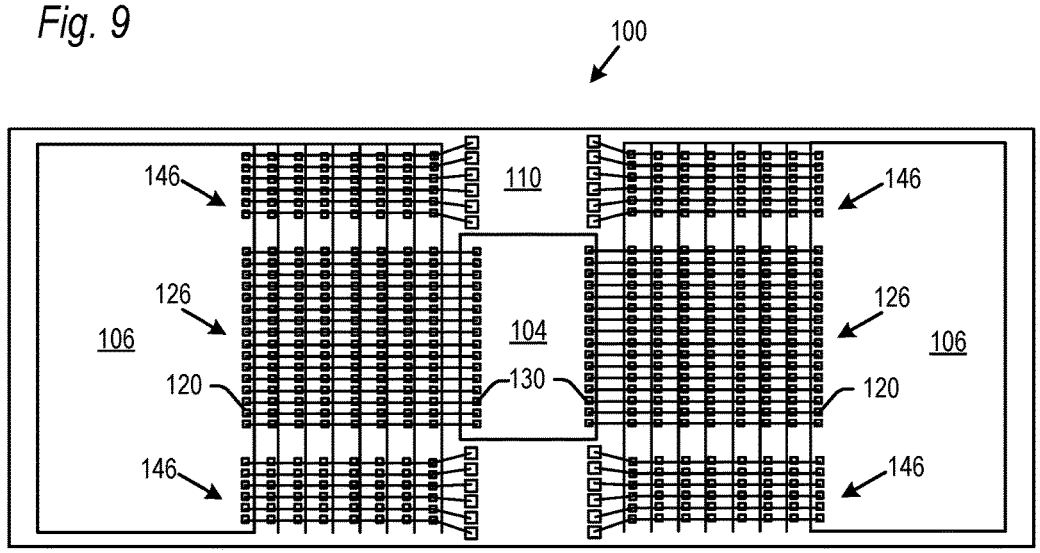
FIGS. 9-10 are top and edge views, respectively, of a semiconductor device including semiconductor die, an interface chip and wire bonds according to a further embodiment of the present technology.
Figure 10:
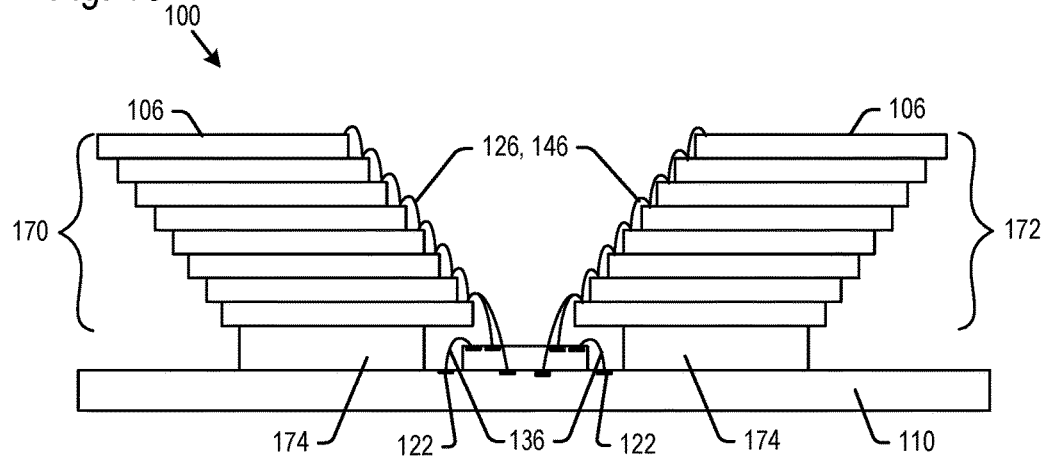

FIGS. 9 and 10 are top and edge views of a further embodiment of the present technology. This embodiment includes a pair of die stacks 170, 172. Both die stacks include offset stepped semiconductor die, with the two stacks being stepped away from each other in opposite directions as shown. Each of the stacks 170, 172 may be supported on a spacer 174. Spacers 174 may be of the same construction as spacer 154 described above. Alternatively, spacers 174 may be formed of solder balls or solder bumps.

In this embodiment, the interface chip 104 may include two rows of die bond pads 130 as shown in FIG. 10 toward a central portion of the interface chip. The semiconductor die 106 in the first and second stacks 170, 172 may be electrically connected to the first and second rows of die bond pads 130, respectively, by wire bonds 176 forming at least substantially straight, parallel lines between the die bond pads 120 on the die 106 in the stacks 170, 172. The wire bonds 176 connect corresponding die bond pads 120 from each semiconductor die to each other to establish wide I/O electrical connections between each semiconductor die 106 in the stacks 170, 172.

In this embodiment, the interface chip 104 may be wire bonded to the substrate 110 off of opposite edges of the interface chip. The spacers 174 are positioned on the substrate on either side of the interface chip 104. Additionally, the spacers 174 have a greater thickness above the substrate than the interface chip 104. As such, wire bonds 136 may be formed between the die bond pads 134 of the interface chip 104 and contact pads 122 of the substrate 110 as described above, but off of two opposed edges of the interface chip 104. The wire bonds 136 may be formed beneath the overhang of the bottommost die 106a of each of the die stacks 170 and 172. As above, each stack 170, 172 may also have die bond pads 120 with direct connections to contact pads 122 on the substrate 110 via wire bonds 166.

In a further embodiment, the plurality of semiconductor die 106 may be stacked in two separate stacks 170 and 172 as shown in FIGS. 9 and 10, but they may be mounted directly on the substrate with no spacers 174. In this embodiment, the interface chip 104 may be mounted between the first and second stacks 170, 172. The first and second stacks 170, 172 may be wire bonded to die bond pads 130 in a central portion of the interface chip 104 by wire bonds 126. The interface chip 104 may in turn be wire bonded to the substrate by wire bonded to the substrate by wire bonds 136 which extend from the interface chip 104 to contact pads 122 on the substrate. The contact pads 122 may be provided on the substrate between the bottommost semiconductor die in stacks 170, 172 and the interface chip 104.

FIG. 11 is an edge view of a further embodiment of the present technology. FIG. 11 is similar to the embodiment of FIGS. 3-6. However, in this embodiment, the bottom most die 106a of die stack 114 is supported on both a spacer 180 and the leading edge of the interface chip 104. Spacer 180 may be of the same construction as spacer 174 described above, but may be the same thickness as the interface chip 104 in this embodiment. The die stack 114 may be supported entirely on spacer 180 and spaced from the interface chip 104 in an alternative of this embodiment.

The wire bonds may be as described above for FIGS. 3-6, with the exception that a first group of semiconductor die (i.e., the top half of die 106) have wire bonds 126 that jump directly to a first row of die bond pads 130 on the interface chip 104. A second group of semiconductor die (i.e., the bottom half of die 106) have wire bonds 126 that are wire bonded to a second row of die bond pads 130 on the interface chip 104. In an alternative of this embodiment, all wire bonds may be the same as described above with respect to FIGS. 3-6.

FIG. 12 is an edge view of a further embodiment of the present technology. This embodiment includes first and second groups 114a, 114b of semiconductor die 106, as in the embodiment of FIGS. 7-8. The wire bonds may be the same as described above for FIGS. 7-8. In the embodiment of FIG. 12, the first and second groups 114a, 114b of semiconductor die may be supported on a spacer 180 as in FIG. 11 described above. The groups 114a, 114b may be supported entirely on the spacer 180, or on the spacer 180 and a leading edge of the interface chip 104 as shown.

A semiconductor device 100 in accordance with any of the above-described embodiments may be a fixed or removable memory storage device used with a host device. The host device may include a controller (not shown) for transferring data and signals to/from the interface chip 104 and die 106. In a further embodiment, in addition to the functionality described above, the interface chip 104 may be a fully functioning controller die, such as for example an ASIC.

The semiconductor device 100, wire bonded according to the embodiments described above, provides significant advantages in that it provides high overall interface performance and low power while using low cost packaging techniques (wire bonding). This provides advantages over high cost, more complicated packaging techniques such as through silicon via (TSV) connections.

In summary, an example of the present technology relates to a semiconductor device, comprising: a substrate; an interface chip mounted to the substrate; a group of one or more semiconductor die stacked on one of the substrate and the interface chip; a first set of wire bonds extending in straight parallel paths between the group of one or more semiconductor die and the interface chip, the first set of wire bonds supporting wide I/O data exchange between the group of one or more semiconductor die and the interface chip; and a second set of wire bonds extending between the interface chip and the substrate, the second set of wire bonds supporting narrow I/O data exchange between the interface chip and the substrate.

In another example, the present technology relates to a semiconductor device, comprising: a substrate comprising contact pads; an interface chip mounted to the substrate, the interface chip comprising a plurality of rows of die bond pads comprising a first row of die bond pads and a second row of die bond pads; a group of one or more semiconductor die stacked on one of the substrate and the interface chip, each semiconductor die of the plurality of semiconductor die having a row of die bond pads; a first set of wire bonds extending in straight parallel paths between the die bond pads on the group of one or more semiconductor die and the first row of die bond pads of the interface chip, the first row of die bond pads having the same size and spacing as the one or more rows of die bond pads on the group of one or more semiconductor die, the first set of wire bonds supporting wide I/O data exchange between the group of one or more semiconductor die and the interface chip; and a second set of wire bonds extending between the second row of die bond pads on the interface chip and the contact pads of the substrate, the second set of wire bonds supporting narrow I/O data exchange between the interface chip and the substrate.

In a further example, the present technology relates to a semiconductor device, comprising: a substrate comprising contact pads; an interface chip mounted to the substrate, the interface chip comprising a plurality of rows of die bond pads comprising a first row of die bond pads and a second row of die bond pads; a group of one or more semiconductor die stacked on one of the substrate and the interface chip, each semiconductor die of the plurality of semiconductor die having a row of die bond pads; a first set of wire bonds extending in straight parallel paths between the die bond pads on the group of one or more semiconductor die and the first row of die bond pads of the interface chip, the first row of die bond pads having the same size and spacing as the one or more rows of die bond pads on the group of one or more semiconductor die, the first set of wire bonds supporting wide I/O data exchange between the group of one or more semiconductor die and the interface chip; a second set of wire bonds extending between the second row of die bond pads on the interface chip and the contact pads of the substrate, the second set of wire bonds supporting narrow I/O data exchange between the interface chip and the substrate; and a third set of wire bonds extending between die bond pads on a semiconductor die of the group of one or more semiconductor die and contact pads on the substrate.

The foregoing detailed description has been presented for purposes of illustration and description. It is not intended to be exhaustive or to limit the description to the precise form disclosed. Many modifications and variations are possible in light of the above teaching. The described embodiments were chosen in order to best explain the principles of the claimed system and its practical application to thereby enable others skilled in the art to best utilize the claimed system in various embodiments and with various modifications as are suited to the particular use contemplated. It is intended that the scope of the method be defined by the claims appended hereto.

We claim:

1. A semiconductor device, comprising:
a substrate;
an interface chip mounted to the substrate;
a group of one or more semiconductor die stacked on one of the substrate and the interface chip;
a first set of wire bonds extending in straight parallel paths between the group of one or more semiconductor die and the interface chip, the first set of wire bonds supporting wide I/O data exchange between the group of one or more semiconductor die and the interface chip; and
a second set of wire bonds extending between the interface chip and the substrate, the second set of wire bonds supporting narrow I/O data exchange between the interface chip and the substrate.

2. The semiconductor device of claim 1, wherein the wide I/O interface is a data bus including greater than 8 contact pads.

3. The semiconductor device of claim 1, wherein the narrow I/O interface is an 8 bit data bus.

4. The semiconductor device of claim 1, wherein the plurality of semiconductor die comprise a single stack of semiconductor die stepped in a same direction and with a same offset from each other.

5. The semiconductor device of claim 1, wherein the plurality of semiconductor die comprise at least two separate groups of semiconductor die, the first group stacked in a first stepped offset pattern, and the second group stacked on the first group in a second stepped offset pattern in the same direction as the first group, the first group offset from the second group.

6. The semiconductor device of claim 1, further comprising a third set of wire bonds extending directly from a bottommost semiconductor die directly to the substrate.

7. The semiconductor device of claim 6, wherein the third set of wire bonds support wide I/O data exchange between the plurality of semiconductor die and the substrate.

8. The semiconductor device of claim 1, wherein the first set of wire bonds comprise a first set of electrical connections to a first row of die bond pads on the interface chip from a semiconductor die of the plurality of semiconductor die nearest the interface chip.

9. The semiconductor device of claim 8, wherein the first set of wire bonds further comprise a second set of electrical connections to the interface chip to a second row of die bond pads on the interface chip from a semiconductor die of the plurality of semiconductor die between the bottommost and top most semiconductor die in the stacked semiconductor die.

10. The semiconductor device of claim 1, further comprising a spacer for spacing the plurality of semiconductor die from the substrate.

11. The semiconductor die of claim 10, wherein the plurality of semiconductor die are partially supported on the spacer and partially supported on the interface chip.

12. The semiconductor device of claim 1, wherein the plurality of semiconductor die comprise two separate stacks of semiconductor die, the first stack offset from each other and stepped in a first direction, and the second stack offset from each other and stepped in a second direction opposite the first direction, the first stack affixed to one of the substrate and interface chip and the second stack affixed to one of the substrate and interface chip.

13. The semiconductor device of claim 12, wherein the first set of wire bonds extend from semiconductor die in the first and second stacks to die bond pads in a central portion of the interface chip, and wherein the second set of wire bonds extend from the interface chip to the substrate, the second set of wire bonds positioned nearer to opposed edges of the interface chip than the first set of wire bonds.

14. A semiconductor device, comprising:
   a substrate comprising contact pads;
   an interface chip mounted to the substrate, the interface chip comprising a plurality of rows of die bond pads comprising a first row of die bond pads and a second row of die bond pads;
   a group of one or more semiconductor die stacked on one of the substrate and the interface chip, each semiconductor die of the plurality of semiconductor die having a row of die bond pads;
   a first set of wire bonds extending in straight parallel paths between the die bond pads on the group of one or more semiconductor die and the first row of die bond pads of the interface chip, the first row of die bond pads having the same size and spacing as the one or more rows of die bond pads on the group of one or more semiconductor die, the first set of wire bonds supporting wide I/O data exchange between the group of one or more semiconductor die and the interface chip; and
   a second set of wire bonds extending between the second row of die bond pads on the interface chip and the contact pads of the substrate, the second set of wire bonds supporting narrow I/O data exchange between the interface chip and the substrate.

15. The semiconductor device of claim 14, wherein the second row of die bond pads on the interface chip are smaller than the contact pads on the substrate, the second set of wire bonds fanning out between the interface chip and the substrate.

16. The semiconductor device of claim 14, wherein the second row of die bond pads on the interface chip have a same size and spacing as the contact pads on the substrate, the second set of wire bonds extending in straight parallel lines between the interface chip and the substrate.

17. The semiconductor device of claim 16, wherein the first set of wire bonds comprise a first set of electrical connections to the first row of die bond pads on the interface chip from a semiconductor die of the plurality of semiconductor die nearest the interface chip.

18. The semiconductor device of claim 17, wherein the first set of wire bonds further comprise a second set of electrical connections to the interface chip to a third row of die bond pads on the interface chip from a semiconductor die of the plurality of semiconductor die between the bottommost and top most semiconductor die in the stacked semiconductor die.

19. The semiconductor device of claim 14, further comprising a spacer for spacing the plurality of semiconductor die from the substrate.

20. The semiconductor device of claim 19, wherein the plurality of semiconductor die are partially supported on the spacer and partially supported on the interface chip.

21. A semiconductor device, comprising:
   a substrate comprising contact pads;
   an interface chip mounted to the substrate, the interface chip comprising a plurality of rows of die bond pads comprising a first row of die bond pads and a second row of die bond pads;
   a group of one or more semiconductor die stacked on one of the substrate and the interface chip, each semiconductor die of the plurality of semiconductor die having a row of die bond pads;
   a first set of wire bonds extending in straight parallel paths between the die bond pads on the group of one or more semiconductor die and the first row of die bond pads of the interface chip, the first row of die bond pads having the same size and spacing as the one or more rows of die bond pads on the group of one or more semiconductor die, the first set of wire bonds supporting wide I/O data exchange between the group of one or more semiconductor die and the interface chip;
   a second set of wire bonds extending between the second row of die bond pads on the interface chip and the contact pads of the substrate, the second set of wire bonds supporting narrow I/O data exchange between the interface chip and the substrate; and
   a third set of wire bonds extending between die bond pads on a semiconductor die of the group of one or more semiconductor die and contact pads on the substrate.

22. The semiconductor device of claim 21, wherein the third set of wire bonds support wide I/O data exchange between the plurality of semiconductor die and the substrate.

23. The semiconductor device of claim 21, wherein the second row of die bond pads on the interface chip are smaller than the contact pads on the substrate, the second set of wire bonds fanning out between the interface chip and the substrate.

24. The semiconductor device of claim 21, wherein the second row of die bond pads on the interface chip have a same size and spacing as the contact pads on the substrate, the second set of wire bonds extending in straight parallel lines between the interface chip and the substrate.

25. The semiconductor device of claim 21, further comprising a spacer for spacing the plurality of semiconductor die from the substrate.

26. The semiconductor device of claim 25, wherein the plurality of semiconductor die are partially supported on the spacer and partially supported on the interface chip.

* * * * *

UNITED STATES PATENT AND TRADEMARK OFFICE
CERTIFICATE OF CORRECTION

PATENT NO. : 9,899,347 B1
APPLICATION NO. : 15/454194
DATED : February 20, 2018
INVENTOR(S) : M. Mostovoy et al.

Page 1 of 1

It is certified that error appears in the above-identified patent and that said Letters Patent is hereby corrected as shown below:

On the Title Page

Please insert:
-- Foreign Application Priority Data
Dec. 6, 2016 (IN)...... 201641041584 --

Signed and Sealed this
Eighteenth Day of September, 2018

Andrei Iancu
*Director of the United States Patent and Trademark Office*